(12) United States Patent
Song et al.

(10) Patent No.: US 12,073,884 B2
(45) Date of Patent: Aug. 27, 2024

(54) STORAGE DEVICE AND OPERATING METHOD THEREOF

(71) Applicant: SAMSUNG ELECTRONICS CO., LTD., Suwon-si (KR)

(72) Inventors: Won Jong Song, Seoul (KR); Doo Hyun Kim, Hwaseong-si (KR); Soon Young Kim, Hwaseong-si (KR); Il Han Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 128 days.

(21) Appl. No.: 17/810,067

(22) Filed: Jun. 30, 2022

(65) Prior Publication Data
US 2023/0153030 A1 May 18, 2023

(30) Foreign Application Priority Data
Nov. 15, 2021 (KR) .......................... 10-2021-0156466

(51) Int. Cl.
G11C 7/02 (2006.01)
G06F 3/06 (2006.01)
G11C 16/04 (2006.01)
G11C 16/10 (2006.01)

(52) U.S. Cl.
CPC ............ G11C 16/10 (2013.01); G06F 3/0679 (2013.01); G11C 16/0483 (2013.01)

(58) Field of Classification Search
CPC ..................................................... G11C 16/10
See application file for complete search history.

(56) References Cited

U.S. PATENT DOCUMENTS

| | | | |
|---|---|---|---|
| 8,000,923 B2 | 8/2011 | Inukai et al. | |
| 8,274,836 B2 * | 9/2012 | Harada | G11C 11/5628 |
| | | | 365/185.17 |
| 9,671,969 B2 * | 6/2017 | Shim | G06F 3/0688 |
| 9,760,437 B2 | 9/2017 | Chinnakkonda Vidyapoornachary et al. | |
| 10,636,488 B2 | 4/2020 | Lin et al. | |
| 10,978,145 B2 * | 4/2021 | Ray | G11C 11/5628 |
| 11,043,266 B1 * | 6/2021 | Tagar | G11C 7/04 |
| 11,069,412 B2 * | 7/2021 | Shin | G11C 16/3459 |
| 11,574,691 B2 * | 2/2023 | Cho | G11C 7/04 |
| 11,579,796 B2 * | 2/2023 | Sanuki | G06F 3/0604 |
| 11,735,267 B2 * | 8/2023 | Shin | G11C 16/20 |
| | | | 711/103 |

FOREIGN PATENT DOCUMENTS

| | | | | |
|---|---|---|---|---|
| CN | 1354521 | | 6/2002 | |
| CN | 1508874 | | 6/2004 | |
| CN | 101388252 A | * | 3/2009 | ......... G11C 11/5628 |
| CN | 105762075 A | * | 7/2016 | ........... H01L 21/324 |
| CN | 116129975 A | * | 5/2023 | ........... G06F 3/0604 |

(Continued)

Primary Examiner — Viet Q Nguyen
(74) Attorney, Agent, or Firm — F. Chau & Associates, LLC

(57) ABSTRACT

A storage device includes a storage controller that receives a protecting command before a thermal process is performed in the storage device, and that generates a protecting pattern by programming a protecting voltage in a converged region where threshold voltage distributions of memory cells in the storage device converge after the thermal process is performed on the storage device.

20 Claims, 10 Drawing Sheets

(56) References Cited

FOREIGN PATENT DOCUMENTS

| KR | 10-2006-0116909 | 11/2006 | | |
|----|----|----|----|----|
| KR | 10-2007-0035277 | 3/2007 | | |
| KR | 10-2008-0072892 | 8/2008 | | |
| KR | 10-2008-0078192 | 8/2008 | | |
| KR | 10-2009-0086815 | 8/2009 | | |
| KR | 10-2014-0145835 | 12/2014 | | |
| KR | 2017002422 A | * 1/2017 | ............. | B23B 27/00 |
| KR | 10-2019-0137000 | 12/2019 | | |
| KR | 10-2020-0025820 | 3/2020 | | |
| KR | 10-2317788 | 10/2021 | | |

* cited by examiner

STORAGE DEVICE AND OPERATING METHOD THEREOF

CROSS-REFERENCE TO RELATED APPLICATION

This application claims priority under 35 U.S.C. § 119 to Korean Patent Application No. 10-2021-0156466, filed on Nov. 15, 2021 in the Korean Intellectual Property Office, the disclosure of which is incorporated by reference herein in its entirety.

TECHNICAL FIELD

Embodiments of the present disclosure relate to a storage device and an operating method thereof.

DISCUSSION OF RELATED ART

The number of storable bits of a memory cell that stores data in a non-volatile memory device is increasing. Accordingly, the degree of integration of a process for manufacturing the non-volatile memory device is also increasing.

In this case, a thermal process may be performed in a process of assembling a storage device including the non-volatile memory device post manufacturing (e.g., during assembly of a board of a customer who purchased the storage device).

In this case, due to heat applied to the storage device, defects may occur in memory cells in the storage device.

SUMMARY

Embodiments of the present disclosure provide a storage device in which efficiency of preventing or reducing deterioration of memory cells due to a thermal process applied to the storage device is increased.

Embodiments of the present disclosure provide an operating method of a storage device in which efficiency of preventing or reducing deterioration of memory cells due to a thermal process applied to the storage device is increased.

Embodiments of the present disclosure provide a method of protecting cells in a storage device in which efficiency of preventing deterioration of memory cells due to a thermal process applied to the storage device is improved.

According to an embodiment of the present disclosure, a storage device includes a storage controller that receives a protecting command before a thermal process is performed in the storage device, and that generates a protecting pattern by programming a protecting voltage in a converged region where threshold voltage distributions of memory cells in the storage device converge after the thermal process is performed on the storage device.

According to an embodiment of the present disclosure, an operating method of a storage device includes, receiving, through a storage controller, a protecting command for generating a protecting pattern by programming a protecting voltage in a converged region where threshold voltage distributions of memory cells in the storage device converge when a thermal process is performed on the storage device, programming the protecting pattern in the converged region by applying the protecting voltage received from the storage controller to a non-volatile memory that stores data, and transmitting a response indicating that the protecting pattern is programmed in the non-volatile memory from the non-volatile memory to the storage controller.

According to an embodiment of the present disclosure, an operating method of protecting cells includes determining a converged region in which threshold voltage distributions of memory cells in a storage device converge when heat is applied to the storage device, programming a protecting voltage in the converged region before the heat is applied to the storage device, and performing a thermal process on the storage device.

BRIEF DESCRIPTION OF THE DRAWINGS

The above and other aspects and features of the present disclosure will become more apparent by describing in detail embodiments thereof with reference to the accompanying drawings, in which.

DETAILED DESCRIPTION OF THE EMBODIMENTS

Figure 1:
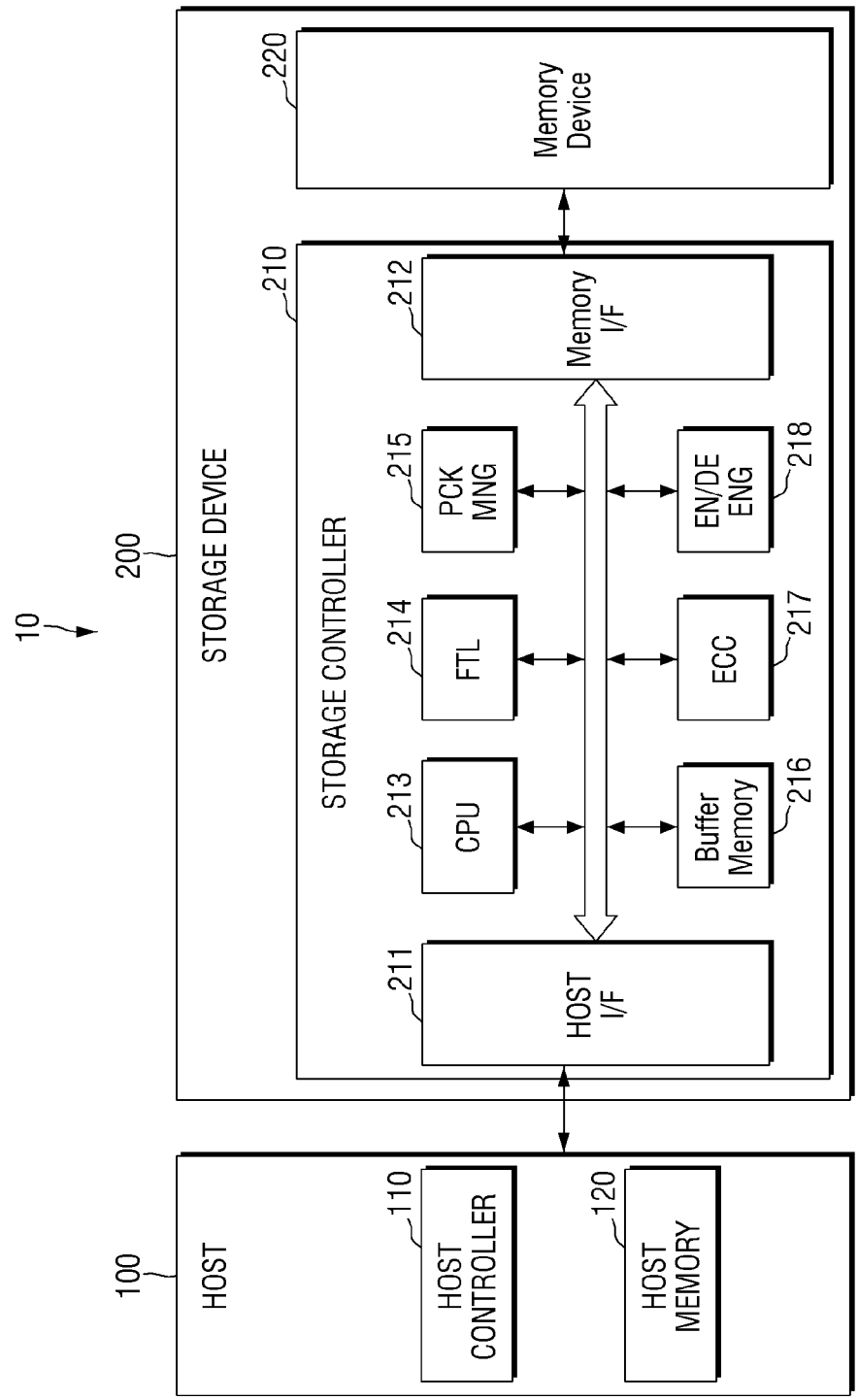
FIG. 1 is a block diagram illustrating a storage system according to example embodiments.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an example embodiment may be described as a "second" element in another example embodiment.

It should be understood that descriptions of features or aspects within each example embodiment should typically be considered as available for other similar features or aspects in other example embodiments, unless the context clearly indicates otherwise.

As used herein, the singular forms "a", "an" and "the" are intended to include the plural forms as well, unless the context clearly indicates otherwise.

FIG. 1 is a block diagram illustrating a storage system according to example embodiments.

Referring to FIG. 1, a storage system 10 may include a host 100 and a storage device 200. In addition, the storage device 200 may include a storage controller 210 and a memory device 220. In addition, according to an example embodiment of the present disclosure, the host 100 may include a host controller 110 and a host memory 120. The host memory 120 may function as a buffer memory for temporarily storing data to be transmitted to the storage device 200 or data transmitted from the storage device 200.

The storage device 200 may include storage media for storing data according to a request from the host 100. As an example, the storage device 200 may include at least one of a solid state drive (SSD), an embedded memory, and a removable external memory. When the storage device 200 is an SSD, the storage device 200 may be a device conforming to a non-volatile memory express (NVMe) standard. When the storage device 200 is an embedded memory or an external memory, the storage device 200 may be a device conforming to a universal flash storage (UFS) or embedded multi-media card (eMMC) standard. Each of the host 100 and the storage device 200 may generate and transmit a packet according to an adopted standard protocol.

When the memory device 220 of the storage device 200 includes a flash memory, the flash memory may include a 2D NAND memory array or a 3D (or vertical) NAND (VNAND) memory array.

According to an example embodiment, the host controller 110 and the host memory 120 may be implemented as separate semiconductor chips. Alternatively, in example embodiments, the host controller 110 and the host memory 120 may be integrated on the same semiconductor chip. As an example, the host controller 110 may be any one of a plurality of modules included in an application processor, and the application processor may be implemented as a system on chip (SoC). In addition, the host memory 120 may be an embedded memory provided in the application processor or may be a non-volatile memory or a memory module disposed outside of the application processor.

The host controller 110 may manage an operation of storing data (e.g., write data) of a buffer region of the host memory 120 in the memory device 220, or storing data (e.g., read data) of the memory device 220 in the buffer region.

The storage controller 210 may include a host interface 211, a memory interface 212, and a central processing unit (CPU) 213. In addition, the storage controller 210 may further include a flash translation layer (FTL) 214, a packet manager 215, a buffer memory 216, an error correction code (ECC) engine, and an encryption/decryption engine 218. The storage controller 210 may further include a working memory to which the flash translation layer (FTL) 214 is loaded, and data write and read operations to the memory device 220 may be controlled by the CPU 213 executing the flash translation layer.

The host interface 211 may transmit and receive packets to and from the host 100. The packet transmitted from the host 100 to the host interface 211 may include, for example, a command, data to be written to the memory device 220, etc., and the packet transmitted from the host interface 211 to the host 100 may include, for example, a response to the command, data read from the memory device 220, etc. The memory interface 212 may transmit data to be written to the memory device 220 to the memory device 220 or may receive data read from the memory device 220. The memory interface 212 may be implemented to comply with a standard protocol such as toggle or open NAND flash interface (ONFI).

The flash translation layer 214 may perform several functions such as, for example, address mapping, wear-leveling, and garbage collection. An address mapping operation is an operation of converting a logical address received from the host 100 into a physical address used to actually store data in the memory device 220. Wear-leveling is a technology for preventing excessive deterioration of a specific block by allowing blocks in the memory device 220 to be uniformly used, and may be implemented through, for example, a firmware technology of balancing erase counts of physical blocks. Garbage collection is a technology for securing a usable capacity in the memory device 220 through a manner of copying valid data of a block to a new block and then erasing an existing block.

The packet manager 215 may generate a packet according to a protocol of an interface negotiated with the host 100 or may parse various information from a packet received from the host 100. In addition, the buffer memory 216 may temporarily store data to be written to the memory device 220 or data to be read from the memory device 220. The buffer memory 216 may be provided in the storage controller 210, but embodiments of the present disclosure are not limited thereto. For example, according to example embodiments, the buffer memory 216 may be disposed outside of the storage controller 210.

The ECC engine 217 may perform an error detection and correction function for read data read from the memory device 220. For example, the ECC engine 217 may generate parity bits for write data to be written into the memory device 220, and the parity bits generated as described above may be stored in the memory device 220 together with the write data. At the time of reading data from the memory device 220, the ECC engine 217 may correct an error of read data using the parity bits read from the memory device 220 together with the read data, and output the read data of which the error is corrected.

The encryption/decryption engine 218 may perform at least one of an encryption operation and a decryption operation on data input to the storage controller 210.

For example, the encryption/decryption engine 218 may perform the encryption operation and/or the decryption operation using a symmetric-key algorithm. In this case, the encryption/decryption engine 218 may perform the encryption and/or decryption operations using, for example, an advanced encryption standard (AES) algorithm or a data encryption standard (DES) algorithm.

In addition, for example, the encryption/decryption engine 218 may perform the encryption operation and/or the decryption operation using a public key encryption algorithm. In this case, for example, the encryption/decryption engine 218 may perform encryption using a public key when performing the encryption operation, and may perform decryption using a private key when performing the decryption operation. For example, the encryption/decryption engine 218 may use a Rivest Shamir Adleman (RSA), Elliptic Curve Cryptography (ECC), or Diffie-Hellman (DH) encryption algorithm.

The encryption/decryption engine 218 is not limited thereto, and the encryption/decryption engine 218 may perform the encryption operation and/or the decryption operation by using, for example, a quantum cryptography technology such as Homomorphic Encryption (HE), Post-Quantum Cryptography (PQC), or Functional Encryption (FE).

Figure 2:
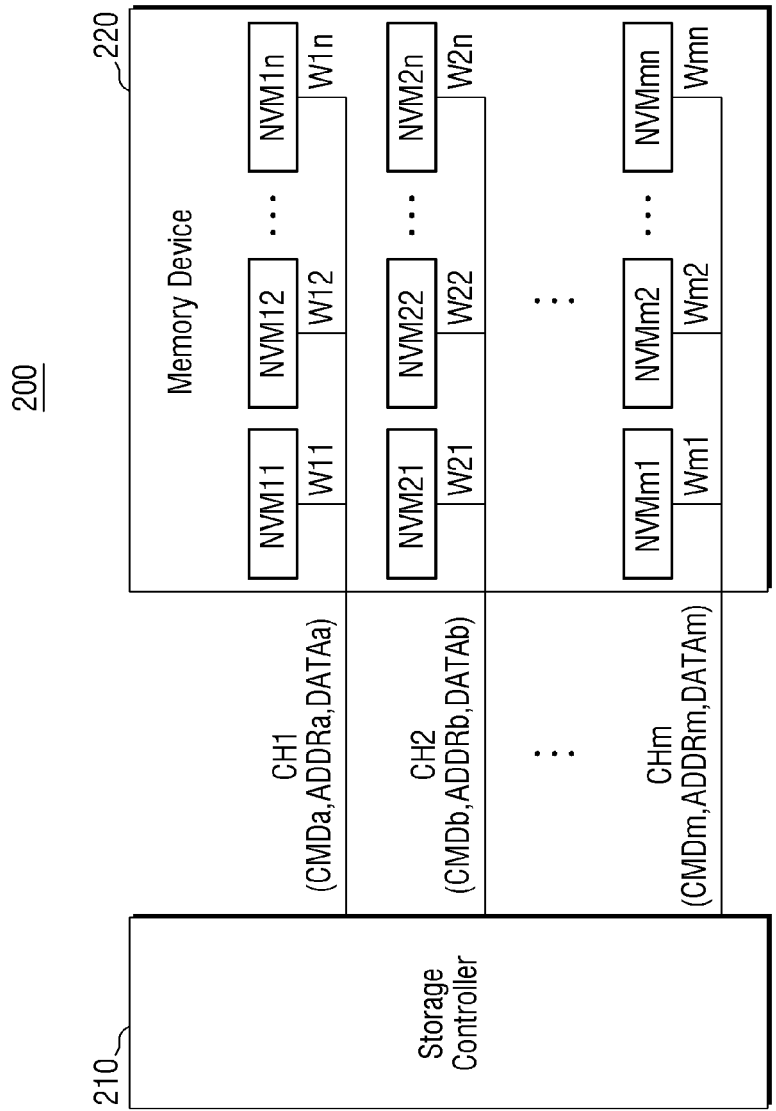
FIG. 2 is a block diagram illustrating the memory device of FIG. 1 according to example embodiments

FIG. 2 is a block diagram illustrating the memory device of FIG. 1 according to example embodiments.

Referring to FIG. 2, the storage device 200 may include a memory device 220 and a storage controller 210. The storage device 200 may support a plurality of channels CH1 to CHm, and the memory device 220 and the storage controller 210 may be connected to each other through the plurality of channels CH1 to CHm. Herein, unless stated otherwise, m is a positive integer. For example, the storage device 200 may be implemented as a storage device such as a solid state drive (SSD).

The memory device 220 may include a plurality of non-volatile memory devices NVM11 to NVMmn. Herein, unless stated otherwise, each of m and n is a positive integer. Each of the non-volatile memory devices NVM11 to NVMmn may be connected to one of the plurality of channels CH1 to CHm through a corresponding way. For example, the non-volatile memory devices NVM11 to NVM1$n$ may be connected to a first channel CH1 through ways W11 to W1$n$, and the non-volatile memory devices NVM21 to NVM2$n$ may be connected to a second channel CH2 through ways W21 to W2$n$.

In an example embodiment, each of the non-volatile memory devices NVM11 to NVMmn may be implemented in an arbitrary memory unit capable of operating according to an individual command from the storage controller 210. For example, each of the non-volatile memory devices NVM11 to NVMmn may be implemented as a chip or die. However, example embodiments of the present disclosure are not limited thereto.

The storage controller 210 may transmit and receive signals to and from the memory device 220 through the plurality of channels CH1 to CHm. For example, the storage controller 210 may transmit commands CMDa to CMDm, addresses ADDRa to ADDRm, and data DATAa to DATAm to the memory device 220, or receive data DATAa to DATAm from the memory device 220, through the channels CH1 to CHm.

The storage controller 210 may select one of the non-volatile memory devices NVM11 to NVMmn connected to a corresponding channel through each channel, and transmit and receive signals to and from the selected non-volatile memory device. For example, the storage controller 210 may select the non-volatile memory device NVM11 of the non-volatile memory devices NVM11 to NVM1$n$ connected to the first channel CH1. The storage controller 210 may transmit the command CMDa, the address ADDRa, and the data DATAa to the selected non-volatile memory device NVM11 or receive the data DATAa from the selected non-volatile memory device NVM11, through the first channel CH1.

The storage controller 210 may transmit and receive signals to and from the memory device 220 in parallel through different channels. For example, the storage controller 210 may transmit a command CMDb to the memory device 220 through the second channel CH2 while transmitting the command CMDa to the memory device 220 through the first channel CH1. For example, the storage controller 210 may transmit a command CMDb to the memory device 220 through the second channel CH2 and transmit a command CMDa to the memory device 220 through the first channel CH1 at substantially the same time. For example, the storage controller 210 may receive data DATAb from the memory device 220 through the second channel CH2 while receiving the data DATAa from the memory device 220 through the first channel CH1. For example, the storage controller 210 may receive data DATAb from the memory device 220 through the second channel CH2 and receive data DATAa from the memory device 220 through the first channel CH1 at substantially the same time.

The storage controller 210 may control an overall operation of the memory device 220. The storage controller 210 may control each of the non-volatile memory devices NVM11 to NVMmn connected to the channels CH1 to CHm by transmitting signals through the channels CH1 to CHm. For example, the storage controller 210 may control a selected non-volatile memory device among the non-volatile memory devices NVM11 to NVM1$n$ by transmitting the command CMDa and the address ADDRa through the first channel CH1.

Each of the non-volatile memory devices NVM11 to NVMmn may operate under the control of the storage controller 210. For example, the non-volatile memory device NVM11 may program the data DATAa according to the command CMDa and the address ADDRa provided through the first channel CH1. For example, the non-volatile memory device NVM21 may read the data DATAb according to the command CMDb and the address ADDRb provided through the second channel CH2, and transmit the read data DATAb to the storage controller 210.

Although it has been illustrated in FIG. 2 that the memory device 220 communicates with the storage controller 210 through m channels and the memory device 220 includes n non-volatile memory devices corresponding to each channel, example embodiments of the present disclosure are not limited thereto. For example, according to example embodiments, the number of channels and the number of non-volatile memory devices connected to one channel may be variously modified.

Figure 3:
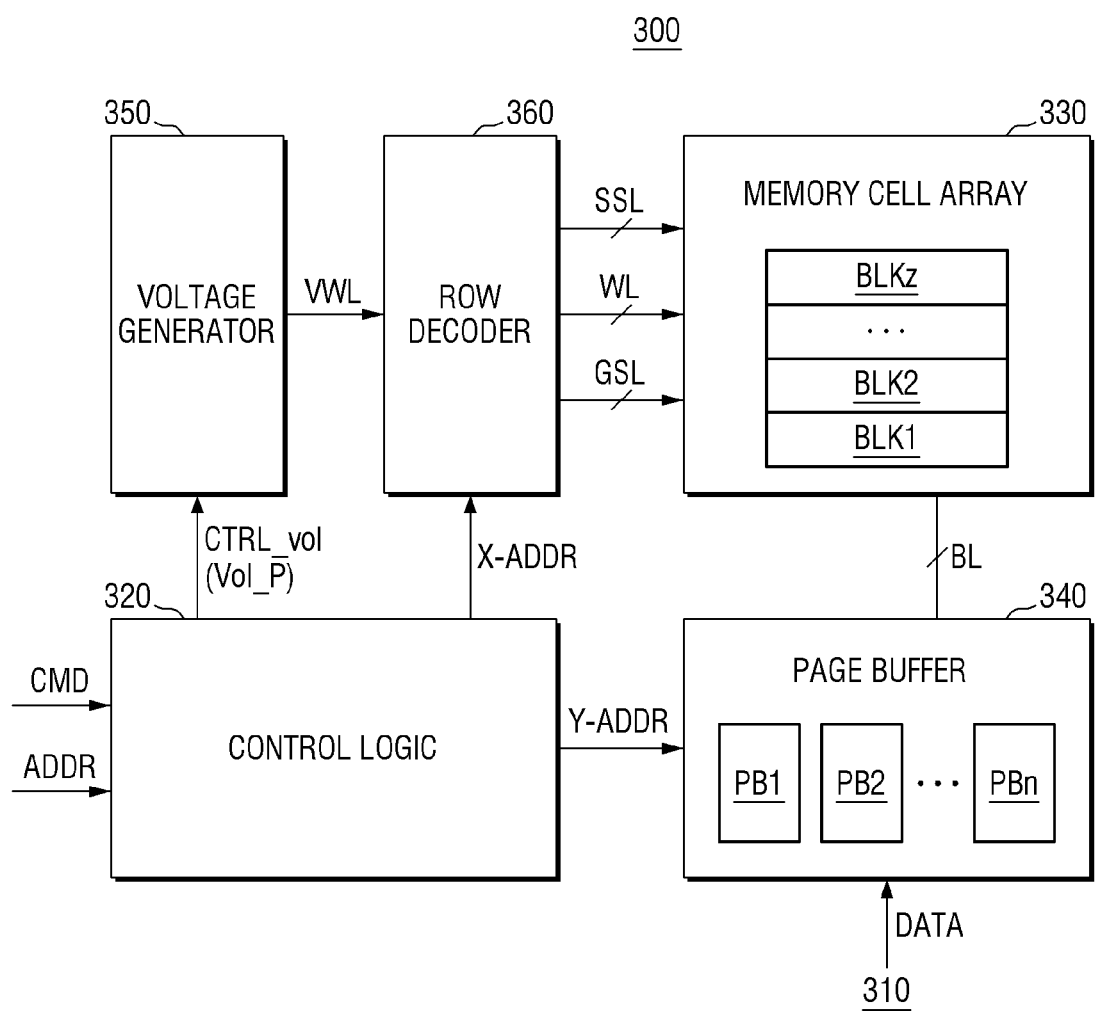
FIG. 3 is a block diagram illustrating the non-volatile memory device of FIG. 2 according to example embodiments

FIG. 3 is a block diagram illustrating the non-volatile memory device of FIG. 2 according to example embodiments.

Referring to FIG. 3, the non-volatile memory device 300 may include a control logic circuit 320, a memory cell array 330, a page buffer 340, a voltage generator 350, and a row decoder 360. According to example embodiments, the non-volatile memory device 300 may further include the memory interface circuit 212$b$ illustrated in FIG. 3, and may further include, for example, a column logic, a pre-decoder, a temperature sensor, a command decoder, an address decoder, etc.

The control logic circuit 320 may generally control various operations within the non-volatile memory device 300. The control logic circuit 320 may output various control signals in response to a command CMD and/or an address ADDR from the memory interface circuit 310. For example, the control logic circuit 320 may output a voltage control signal CTRL_vol, a row address X-ADDR, and a column address Y-ADDR.

In this case, the command CMD and/or the address ADDR may be for each of the plurality of users VM 1 to VM n described with reference to FIG. 2.

The memory cell array 330 may include a plurality of memory blocks BLK1 to BLKz (z is a positive integer), each of which may include a plurality of memory cells. The memory cell array 330 may be connected to the page buffer 340 through bit lines BL, and may be connected to the row decoder 360 through word lines WL, string select lines SSL, and ground select lines GSL.

In an example embodiment, the memory cell array 330 may include a three-dimensional (3D) memory cell array, and the 3D memory cell array may include a plurality of NAND strings. Each NAND string may include memory cells each connected to word lines vertically stacked on a substrate. U.S. Pat. Nos. 7,679,133, 8,553,466, 8,654,587, 8,559,235, and U.S. Patent Application Publication No. 2011/0233648 are incorporated herein by reference. In an example embodiment, the memory cell array 330 may include a two-dimensional (2D) memory cell array, and the 2D memory cell array may include a plurality of NAND strings arranged along row and column directions.

The page buffer 340 may include a plurality of page buffers PB1 to PBn (n is an integer of 3 or more), and the plurality of page buffers PB1 to PBn may be respectively connected to the memory cells through a plurality of bit lines BL. The page buffer 340 may select at least one of the bit lines BL in response to the column address Y-ADDR. The page buffer 340 may operate as a write driver or a sense amplifier according to an operation mode. For example, at the time of a program operation, the page buffer 340 may apply a bit line voltage corresponding to data to be programmed to the selected bit line. At the time of a read operation, the page buffer 340 may sense a current or voltage of the selected bit line to sense data stored in the memory cell.

The voltage generator 350 may generate various types of voltages for performing program, read, and erase operations on the basis of the voltage control signal CTRL_vol. For example, the voltage generator 350 may generate a program voltage, a read voltage, a program verification voltage, an erase voltage, etc., as word line voltages VWL.

The row decoder 360 may select one of a plurality of word lines WL and may select one of a plurality of string select lines SSL, in response to the row address X-ADDR. For example, the row decoder 360 may apply the program voltage and the program verification voltage to the selected word line at the time of the program operation, and may apply the read voltage to the selected word line at the time of the read operation.

Figure 4:
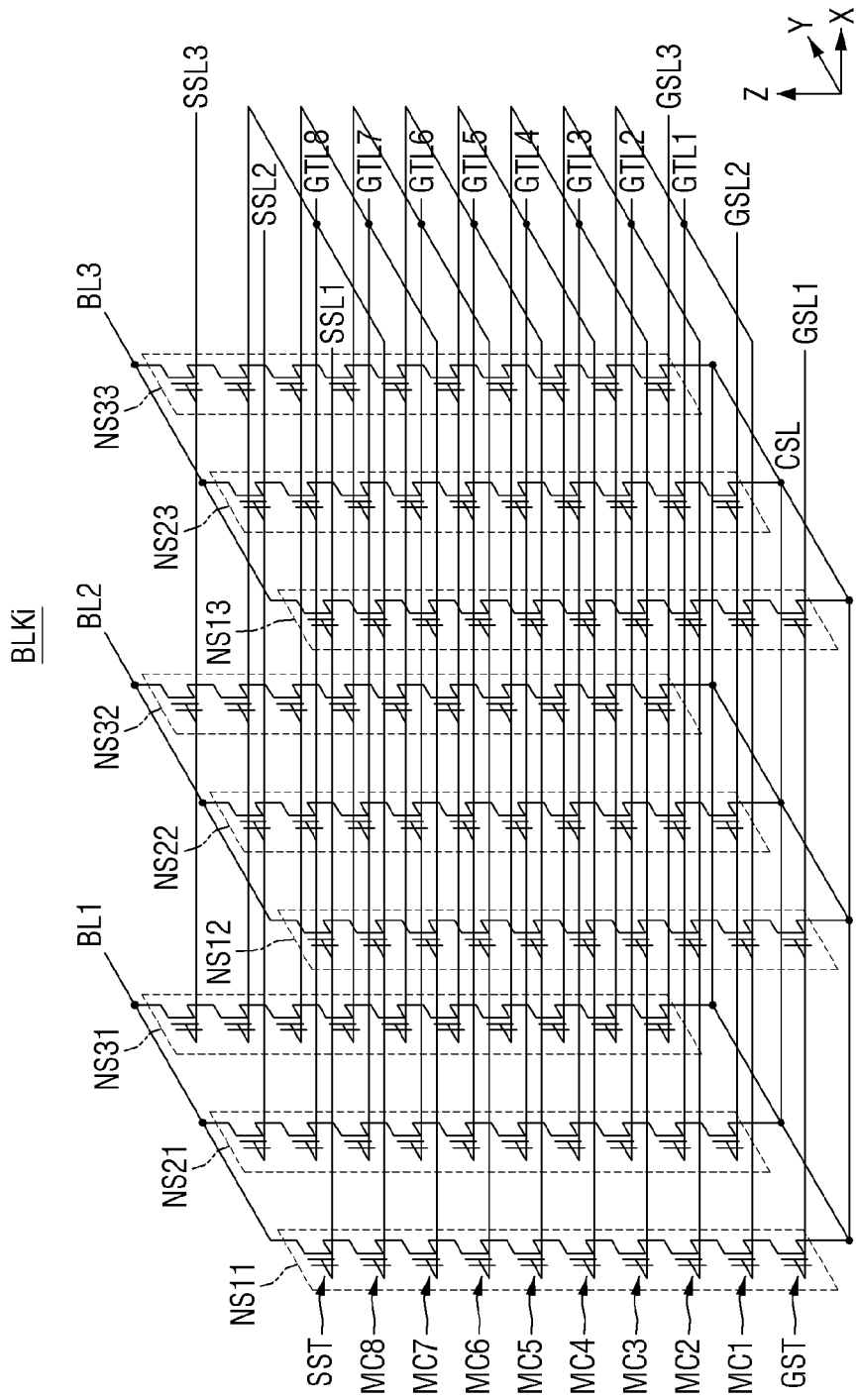
FIG. 4 is a diagram illustrating a 3D V-NAND structure applicable to a nonvolatile memory device according to example embodiments.

FIG. 4 is a diagram illustrating a 3D V-NAND structure applicable to a nonvolatile memory device according to example embodiments.

For example, in the case in which the storage device of FIG. 1 according to example embodiments is applied as a storage module of a UFS device, when the storage module of the UFS device is implemented as a 3D V-NAND type flash memory, each of the plurality of memory blocks constituting the storage module may be represented by an equivalent circuit as illustrated in FIG. 4.

Referring to FIG. 4, a memory block BLKi of the nonvolatile memory device represents a three-dimensional memory block formed on a substrate in a three-dimensional structure. For example, a plurality of memory NAND strings included in the memory block BLKi may be formed in a direction perpendicular to the substrate.

The memory block BLKi may include a plurality of memory NAND strings NS11 to NS33 connected between bit lines BL1, BL2, and BL3 and a common source line CSL. Each of the plurality of memory NAND strings NS11 to NS33 may include a string select transistor SST, a plurality of memory cells MC1, MC2, ..., MC8, and a ground select transistor GST. Although it has been illustrated in FIG. 4 that each of the plurality of memory NAND strings NS11 to NS33 includes eight memory cells MC1, MC2, ..., MC8, embodiments of the present disclosure are not limited thereto.

The string select transistor SST may be connected to a corresponding string select line SSL1, SSL2, or SSL3. The plurality of memory cells MC1, MC2, ..., MC8 may be connected to corresponding gate lines GTL1, GTL2, ..., GTL8, respectively. The gate lines GTL1, GTL2, ..., GTL8 may correspond to word lines, and some of the gate lines GTL1, GTL2, ..., GTL8 may correspond to dummy word lines. The ground select transistor GST may be connected to a corresponding ground select line GSL1, GSL2, or GSL3. The string select transistor SST may be connected to a corresponding bit line BL1, BL2, or BL3, and the ground select transistor GST may be connected to the common source line CSL.

Word lines (e.g., WL1) having the same height may be connected in common, and the ground select lines GSL1, GSL2, and GSL3 and the string select lines SSL1, SSL2, and SSL3 may be separated from each other, respectively. Although it has been illustrated in FIG. 4 that the memory block BLK is connected to the eight gate lines GTL1, GTL2, ..., GTL8 and the three bit lines BL1, BL2, and BL3, embodiments of the present disclosure are not limited thereto.

Figure 5:
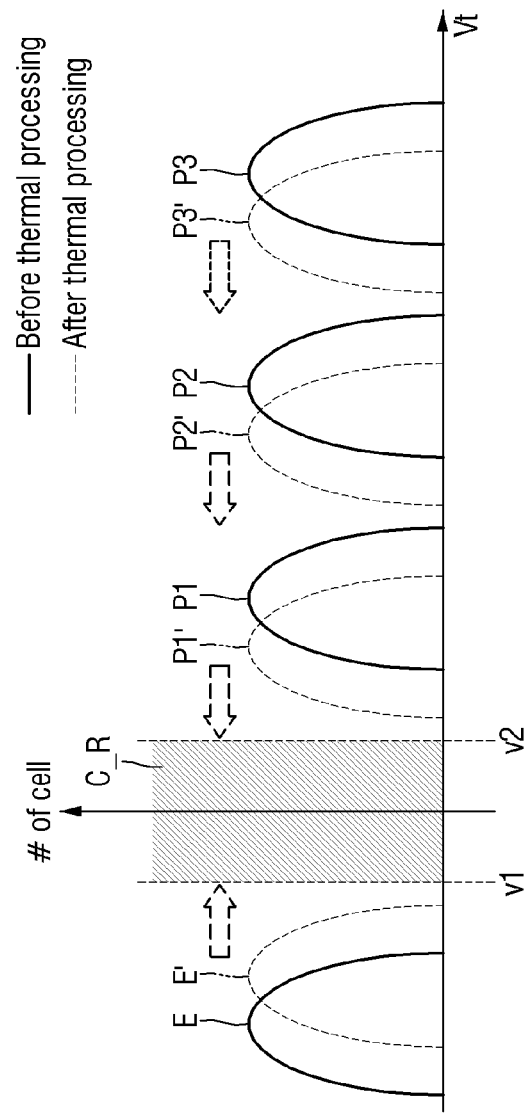
FIG. 5 is a graph illustrating deterioration of a memory cell due to a thermal process.

FIG. 5 is a graph illustrating deterioration of a memory cell due to a thermal process.

Hereinafter, the memory cell will be described as a multi-level cell (MLC) in which 2-bit data is stored. However, the description thereof is not limited thereto, and may also be applied to, for example, a single level cell (SLC) in which 1-bit data is stored and/or a triple level cell (TLC) in which 3-bit data is stored.

Referring to FIGS. 1 to 5, the floating gate transistors MC1 to MC8 constituting the memory cell array 330 may be programmed into one of four logic states. For example, the floating gate transistors MC1 to MC8 constituting the memory cell array 330 may form a first cell distribution voltage programmed to a first logic state. In addition, the floating gate transistors MC1 to MC8 constituting the memory cell array 330 may form a second cell distribution voltage programmed to a second logic state. In addition, the floating gate transistors MC1 to MC8 constituting the memory cell array 330 may form a third cell distribution voltage programmed to a third logic state. In addition, the floating gate transistors MC1 to MC8 constituting the memory cell array 330 may form a fourth cell distribution voltage programmed to a fourth logic state.

That is, the memory cells MC1 to MC8 constituting the memory cell array 330 may be configured as multi-level cells (MLCs) that store 2-bit data.

For example, the first logic state may be an erased state E. The erased state E may represent a state in which the plurality of floating gate transistors MC1 to MC8 are erased, and the second to fourth logic states P1, P2, and P3 may represent a state in which the plurality of floating gate transistors MC1 to MC8 are programmed. The plurality of floating gate transistors MC1 to MC8 may have four threshold voltage distributions corresponding to the four logic states. Logic states of the plurality of floating gate transistors MC1 to MC8 may be determined by a plurality of verification voltages.

In this case, in the process of assembling the storage device 200 post manufacturing (e.g., during assembly of a board of a customer that purchased the storage system), a high-temperature thermal process may be performed. In this case, the threshold voltage distributions of the plurality of floating gate transistors MC1 to MC8 may be changed. That is, due to the high-temperature thermal process, the memory cells MC1 to MC8 of the memory cell array 330 may be deteriorated.

For example, a threshold voltage distribution representing the erased state E may be changed to a deteriorated erased state E' due to the high-temperature thermal process. In addition, a threshold voltage distribution representing a programmed state P1 may be changed to a deteriorated programmed state P1' due to the high-temperature thermal process. In addition, a threshold voltage distribution representing a programmed state P2 may be changed to a deteriorated programmed state P2' due to the high-temperature thermal process. In addition, a threshold voltage distribution representing a programmed state P3 may be changed to a deteriorated programmed state P3' due to the high-temperature thermal process.

That is, the threshold voltage distribution representing the erased state E and the threshold voltage distributions representing the programmed states P1, P2, and P3 may be changed to distributions E', P1', P2', and P3' converging to a converged region C_R due to the thermal process.

In FIG. 5, the converged region C_R is illustrated as being formed between a first voltage v1 and a second voltage v2 that is greater than the erased state E and is smaller than the first programmed state p 1. However, the converged region C_R is not limited thereto. For example, according to example embodiments, the converged region C_R may be generated in another region due to factors such as, for example, a thermal process condition and a difference in the configuration of the storage device 200.

Due to the thermal process applied to the storage device 200, deterioration may occur in the memory cells, so that an interval between a plurality of program states may be narrowed, and information between the plurality of program states may be distorted.

In this case, the storage device 200 according to example embodiments may prevent the deterioration of the memory cells MC1 to MC8 in preparation for the above-described high-temperature thermal process through a protection operation of the storage controller 210 that has received a protecting command for programming a protecting voltage from outside of the storage device 200 (e.g., from the host 100).

Hereinafter, it will be described that the storage device 200 receives a protecting command from the host 100 as an example. However, embodiments of the present disclosure are not limited thereto. For example, according to embodiments, the storage device 200 may also receive the protecting command from another external device other than the host 100.

This will be described in detail with reference to FIGS. 6 to 9 below.

Figure 6:
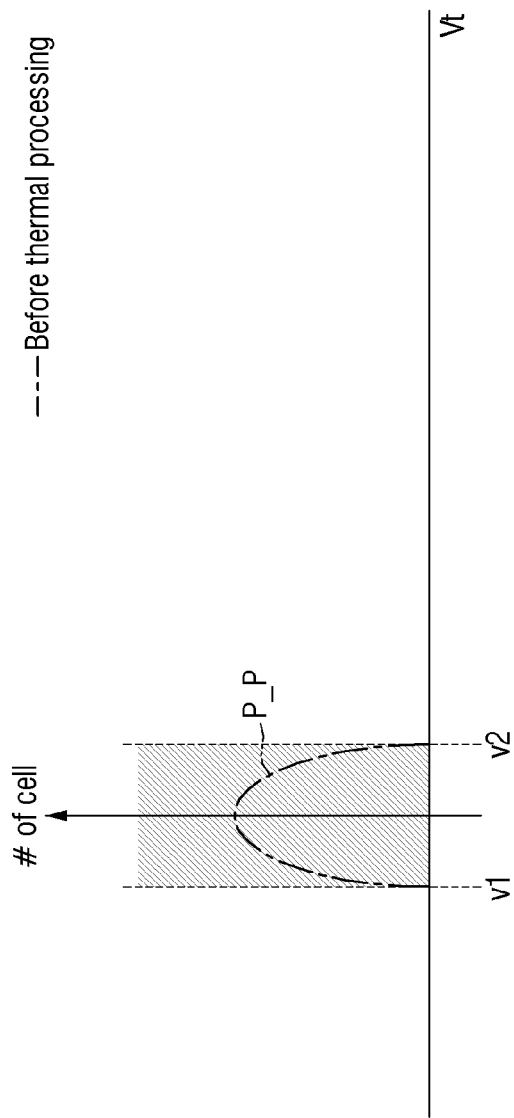
FIG. 6 is a graph of programming a protecting voltage of a storage device according to example embodiments.

FIG. 6 is a graph of programming a protecting voltage of a storage device according to example embodiments.

Referring to FIGS. 1 to 6, before the high-temperature thermal process is performed in the storage device 200, a protecting pattern P_P may be pre-programmed in the converged region C_R. For example, the control logic circuit 320 receiving the command CMD including the protecting command information from the host 100 may transmit the control voltage CTRL_vol to the voltage generator 350 so that the protecting pattern P_P is generated in the converged region C_R. For example, the control logic circuit 320 may transmit the control voltage CTRL_vol including the protecting voltage Vol_P information to the voltage generator 350.

Thereafter, the protecting pattern P_P may be generated in a memory cell at a desired location through the row decoder 360 so that the protecting pattern P_P, which may prevent or reduce deterioration due to the high-temperature thermal process of the memory cells of the memory cell array 330, is generated.

Based on the command CMD including the protecting command information received from the host 100 before the high-temperature thermal process is performed, the protecting pattern P_P may be formed in advance in the memory cells, which may therefore prevent deterioration of the memory cells in advance.

In this case, the protecting pattern P_P may be programmed and formed in the converged region C_R through a one shot program in which the protecting voltage Vol_P is injected as one shot.

In addition, the data may not be separately stored in the protecting pattern P_P programmed through the protecting voltage.

In addition, the command CMD including the protecting command information may be transmitted through an admin command set. For example, the command CMD including the protecting command information may be transmitted from the host 100 to the storage device 200 through a firmware commit command of the admin command set.

Figure 7:
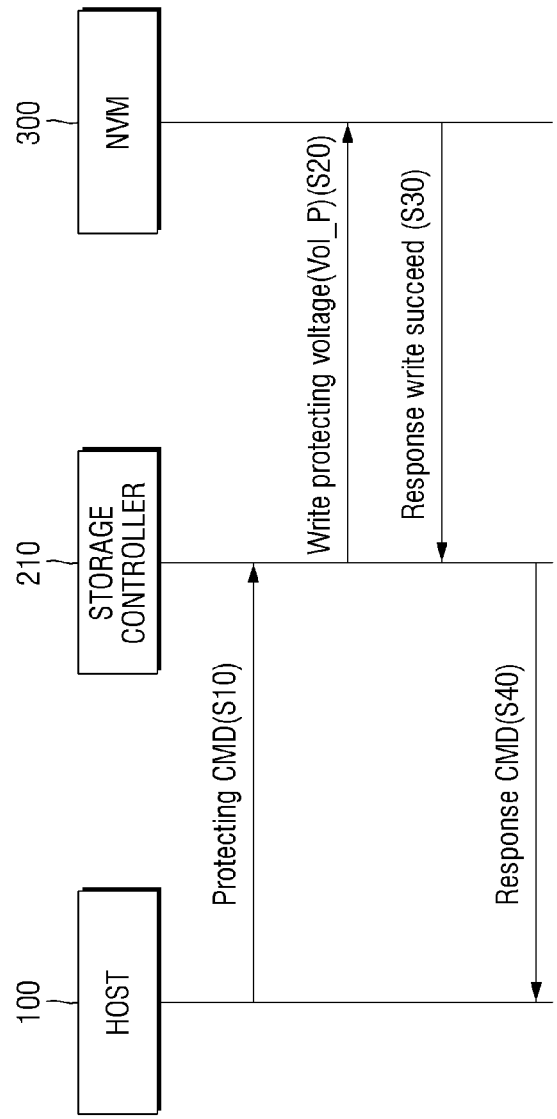
FIG. 7 is a ladder diagram illustrating an operating method of a storage device according to example embodiments.

FIG. 7 is a ladder diagram illustrating an operating method of a storage device according to example embodiments.

Referring to FIGS. 1 to 7, the storage device 200 is assembled post manufacturing (e.g., assembly of a board of the customer), and before the high-temperature thermal process is performed, the command CMD including the protecting command information for generating the protecting pattern P_P in the converged region C_R is transmitted to the storage controller 210 (S10).

Thereafter, the storage controller 210 applies the protecting voltage Vol_P to the non-volatile memory device 300 to generate the protecting pattern P_P in the converged region C_R (S20). For example, according to example embodiments, the storage controller 210 may generate the protecting pattern P_P.

Thereafter, when the generation of the protecting pattern P_P is completed, the non-volatile memory device 300 transmits a protecting pattern P_P program success response to the storage controller 210 (S30).

Thereafter, the storage controller 210 transmits a response command to the command including the protecting command information to the host 100 (S40).

Figure 8:
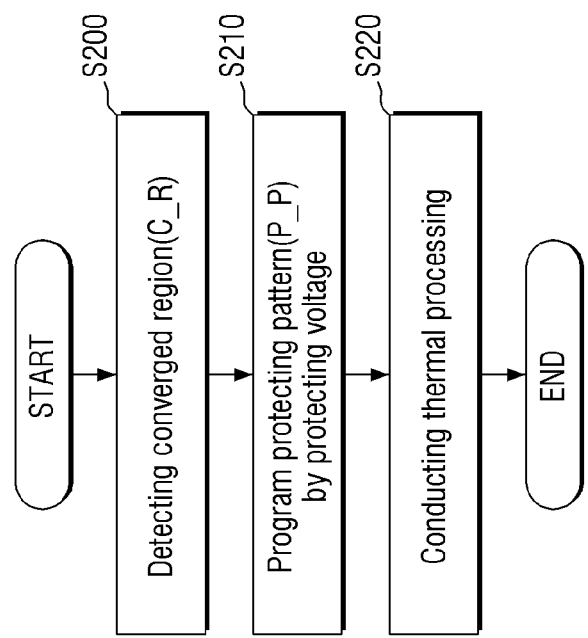
FIG. 8 is a flowchart illustrating an operating method of protecting cells of a storage device according to example embodiments.

FIG. 8 is a flowchart illustrating an operating method of protecting cells of a storage device according to example embodiments.

Referring to FIGS. 1 to 8, when heat is applied to the storage device 200, the storage device 200 may determine, in advance, the converged region C_R in which the threshold voltage distributions of the memory cells in the storage device 200 converge (S200). For example, the converged region C_R may also be determined based on information provided by a purchaser who purchases the storage device 200.

The storage device 200 may generate a protecting pattern P_P by applying a protecting voltage to the converged region C_R before heat is applied to the storage device 200 (S210).

Thereafter, a thermal process may be performed on the storage device 200 (S220).

In this case, since the protecting pattern P_P is previously generated in the storage device 200, deterioration occurring in the memory cells in the storage device 200 may be minimized or reduced by performing the thermal process.

Figure 9:
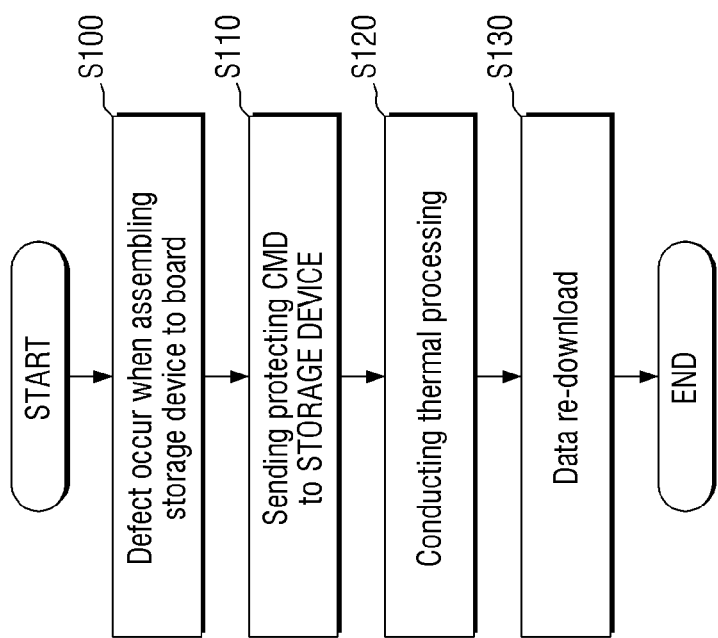
FIG. 9 is a flowchart illustrating a case in which a thermal process is performed on a storage device according to example embodiments.

FIG. 9 is a flowchart illustrating a case in which a thermal process is performed on a storage device according to example embodiments.

FIG. 9 exemplarily describes a case in which a thermal process is performed on the storage device. It is to be understood that the case in which a thermal process is performed on the storage device is not limited thereto.

Referring to FIGS. 1 to 9, it is assumed that a defect occurs in the process of assembling the storage device 200 post manufacturing (e.g., during assembly of a board of a customer) (S100). The defect occurring in the process of assembling the storage device 200 post manufacturing (e.g., during assembly of the board of the customer) may be, for example, a case in which a defect in peripheral components to which the storage device is assembled post manufacturing (e.g., during assembly of the board of the customer) occurs.

In this case, after detaching the storage device 200 (e.g., detaching from the board of the customer), repairing the defect, and then reassembling the storage device 200, a high-temperature thermal process may occur in the storage device 200.

Due to the high-temperature thermal process, the memory cells in the memory cell array 330 of the storage device 200 may be deteriorated. Therefore, before the high-temperature thermal process occurs, the storage device 200 may receive the command CMD including protecting command information for generating the protecting pattern P_P by programming the protecting voltage Vol_P in the converged region C_R (S110).

Through this implementation, the protecting pattern P_P may be generated in the memory cells in the memory cell array 330.

Thereafter, a thermal process is conducted in the process of assembling the storage device 200 (S120).

Thereafter, backed-up data of the storage system 10 or the storage device 200 in which the defect has occurred is re-downloaded (S130).

Figure 10:
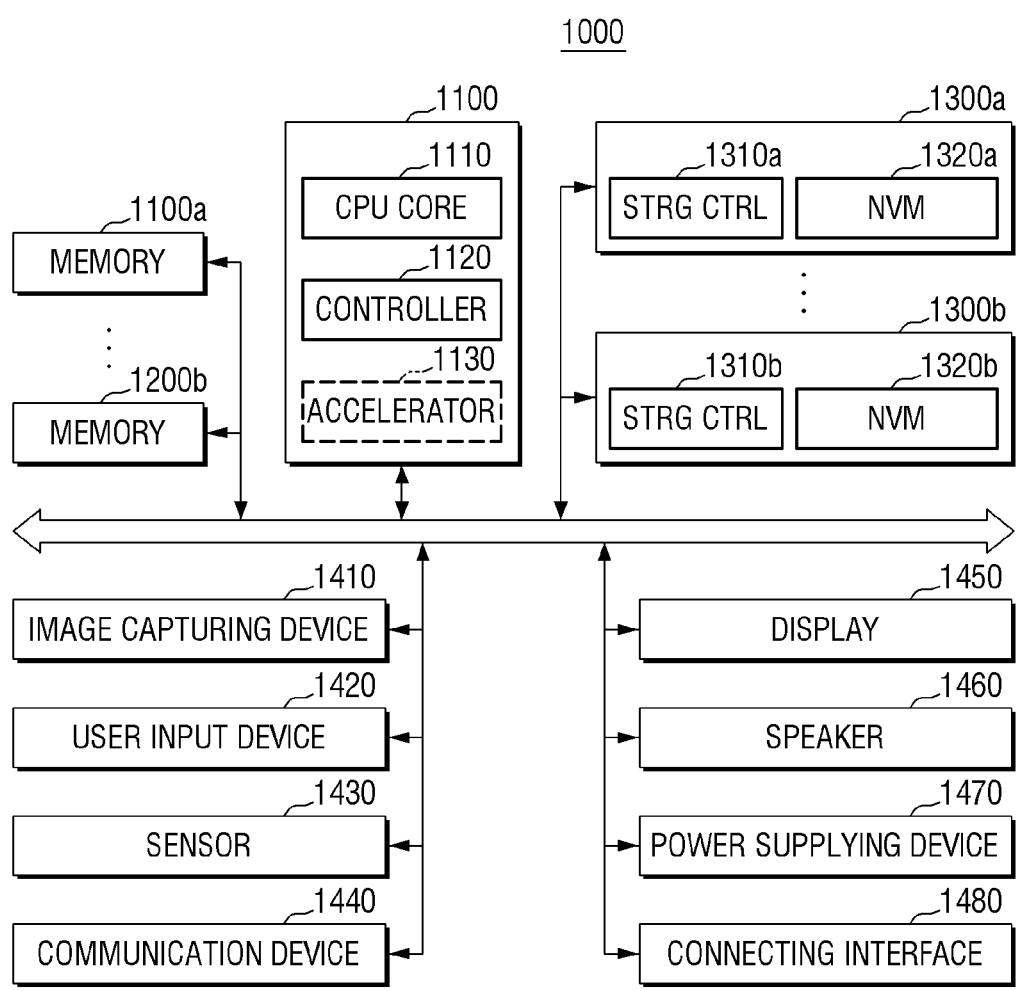
FIG. 10 is a block diagram illustrating a system including a storage system according to example embodiments.

FIG. 10 is a block diagram illustrating a system including a storage system according to example embodiments.

A system 1000 illustrated in FIG. 10 may be a mobile system such as, for example, a mobile phone, a smartphone, a tablet personal computer (PC), a wearable device, a healthcare device, or an Internet of things (JOT) device. However, the system 1000 illustrated in FIG. 10 is not limited thereto. For example, according to embodiments, the system 1000 may be a personal computer, a laptop computer, a server, a media player, an automotive device such as a navigation device, etc.

Referring to FIG. 10, the system 1000 may include a main processor 1100, memories 1200a and 1200b, and storage devices 1300a and 1300b. The system 1000 may further include one or more of an image capturing device 1410, a user input device 1420, a sensor 1430, a communication device 1440, a display 1450, a speaker 1460, a power supplying device 1470, and a connecting interface 1480.

The main processor 1100 may control an overall operation of the system 1000, for example, operations of the other components constituting the system 1000. The main processor 1100 may be implemented as, for example, a general-purpose processor, a dedicated processor, an application processor, etc.

The main processor 1100 may include one or more central processing unit (CPU) cores 1110, and a controller 1120 for controlling the memories 1200a and 1200b and/or the storage devices 1300a and 1300b. According to example embodiments, the main processor 1100 may further include an accelerator 1130, which is a dedicated circuit for high-speed data operation such as artificial intelligence (AI) data operation. Such an accelerator 1130 may include, for example, a graphics processing unit (GPU), a neural processing unit (NPU), a data processing unit (DPU), etc., and may also be implemented as a separate chip physically independent from the other components of the main processor 1100.

The memories 1200a and 1200b may be used as main memory units of the system 1000, and may include volatile memories such as, for example, a static random access memory (SRAM) and/or a dynamic random access memory (DRAM), as well as non-volatile memories such as, for example, a flash memory, a phase change random access memory (PRAM), and/or a resistive random access memory (RRAM). The memories 1200a and 1200b may also be implemented in the same package as the main processor 1100.

The storage devices 1300a and 1300b may function as non-volatile storage devices that store data regardless of whether power is supplied thereto, and may have a storage capacity relatively greater than that of the memories 1200a and 1200b. The storage devices 1300a and 1300b may include storage controllers 1310a and 1310b and non-volatile memories (NVM) 1320a and 1320b that store data under the control of the storage controllers 1310a and 1310b, respectively. The non-volatile memories 1320a and 1320b may include a flash memory having a 2-dimensional (2D) structure or a 3-dimensional (3D) vertical NAND (V-NAND) structure, as well as other types of non-volatile memories such as, for example, a PRAM and/or an RRAM.

The storage devices 1300a and 1300b may include the storage device 200 according to example embodiments.

The storage devices 1300a and 1300b may be included in the system 1000 in a state in which they are physically separated from the main processor 1100 or may be implemented in the same package as the main processor 1100. In addition, the storage devices 1300a and 1300b may have a form such as a solid state device (SSD) or a memory card to be detachably coupled to the other components of the system 1000 through an interface such as a connecting interface 1480 to be described below. Such storage devices 1300a and 1300b may be devices to which a standard protocol such as, for example, universal flash storage (UFS), embedded multi-media card (eMMC), or non-volatile memory express (NVMe) is applied, but are necessarily limited thereto.

The image capturing device 1410 may capture a still image or a moving image, and may be, for example, a camera, a camcorder, and/or a webcam.

The user input device 1420 may receive various types of data input from a user of the system 1000, and may be, for example, a touch pad, a keypad, a keyboard, a mouse, a microphone, etc.

The sensor 1430 may sense various types of physical quantities that may be obtained from outside of the system 1000 and convert the sensed physical quantities into electrical signals. Such a sensor 1430 may be, for example, a temperature sensor, a pressure sensor, an illuminance sensor, a position sensor, an acceleration sensor, a biosensor, a gyroscope, etc.

The communication device 1440 may transmit and receive signals to and from other devices outside of the system 1000 according to various communication protocols. Such a communication device 1440 may be implemented to include, for example, an antenna, a transceiver, a modem, etc.

The display 1450 and the speaker 1460 may function as output devices that output visual information and auditory information to the user of the system 1000, respectively.

The power supplying device 1470 may appropriately convert power supplied from a battery embedded in the system 1000 and/or an external power supply, and supply the converted power to the respective components of the system 1000.

The connecting interface 1480 may provide a connection between the system 1000 and an external device connected to the system 1000 to be capable of transmitting and receiving data to and from the system 1000. The connecting interface 1480 may be implemented in various interface manners such as, for example, an advanced technology attachment (ATA), a serial ATA (SATA), an external SATA (e-SATA), a small computer small interface (SCSI), a serial attached SCSI (SAS), a peripheral component interconnection (PCI), a PCI express (PCIe), an NVM express (NVMe), an institute of electrical and electronic engineers (IEEE) 1394, a universal serial bus (USB), a secure digital (SD) card, a multi-media card (MMC), an embedded multi-media card (eMMC), a universal flash storage (UFS), an embedded UFS (eUFS), and a compact flash (CF) card interface.

As is traditional in the field of the present disclosure, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A storage device, comprising:
   a memory device including a memory cell array including a plurality of memory cells;
   a storage controller configured to:
      determine a converged region in which threshold voltage distributions of the memory cells converge after a thermal process is performed in the storage device, before the thermal process is performed in the storage device;
      receive a protecting command, before the thermal process is performed in the storage device; and
      generate a protecting pattern in the converged region by programming a protecting voltage in the converged region based on the protecting command, before the thermal process is performed in the storage device.

2. The storage device of claim 1, wherein the protecting voltage is programmed through a one shot program.

3. The storage device of claim 1,
   wherein the memory device includes a non-volatile memory that stores data,
   wherein the storage device programs the protecting voltage in the non-volatile memory when receiving the protecting command.

4. The storage device of claim 3, wherein data is not stored in the memory cell in which the protecting voltage is programmed, among the plurality of memory cells.

5. The storage device of claim 1, wherein the protecting command is transmitted through an admin command set.

6. The storage device of claim 5, wherein the protecting command is transmitted through a firmware commit command.

7. The storage device of claim 1, wherein the converged region is a voltage region, the converged region is higher than a first voltage, and the first voltage is greater than an erased state and smaller than a programmed state.

8. The storage device of claim 7, wherein the converged region is lower than a second voltage different from the first voltage, and the second voltage is greater than the erased state and smaller than the programmed state.

9. An operating method of a storage device, the operating method comprising:
   determining a converged region in which threshold voltage distributions of memory cells included in a memory cell array of a non-volatile memory that stores data converge after a thermal process is performed in the storage device, before the thermal process is performed in the storage device;
   receiving, through a storage controller, a protecting command, before the thermal process is performed in the storage device;
   generating a protecting pattern in the converged region by programming a protecting voltage in the converged region based on the protecting command, before the thermal process is performed in the storage device; and
   transmitting a response indicating that the protecting pattern is generated in the non-volatile memory from the non-volatile memory to the storage controller.

10. The operating method of claim 9, wherein the protecting voltage is programmed through a one shot program.

11. The operating method of claim 9, wherein data is not stored in the memory cell in which the protecting voltage is programmed, among the plurality of memory cells.

12. The operating method of claim 9, wherein the protecting command is transmitted through an admin command set.

13. The operating method of claim 12, wherein the protecting command is transmitted through a firmware commit command.

14. The operating method of claim 9, wherein the converged region is a voltage region, the converged region is higher than a first voltage, and the first voltage is greater than an erased state and smaller than a programmed state.

15. The operating method of claim 14, wherein the converged region is lower than a second voltage different from the first voltage, and the second voltage is greater than the erased state and smaller than the programmed state.

16. An operating method of protecting cells, the operating method comprising:
   determining a converged region in which threshold voltage distributions of a plurality of memory cells in a storage device converge when heat is applied to the storage device, before the heat is applied to the storage device;
   receiving a protecting command, before the heat is applied to the storage device;
   programming a protecting voltage in the converged region, before the heat is applied to the storage device; and
   performing a thermal process, in which the heat is applied to the storage device, on the storage device.

17. The operating method of claim 16, wherein the protecting voltage is programmed through a one shot program.

18. The operating method of claim 16, wherein data is not stored in the memory cell in which the protecting voltage is programmed, among the plurality of memory cells.

19. The operating method of claim 16, wherein the converged region is a voltage region, the converged region is higher than a first voltage, and the first voltage is greater than an erased state and smaller than a programmed state.

20. The operating method of claim 19, wherein the converged region is lower than a second voltage different from the first voltage, and the second voltage is greater than the erased state and smaller than the programmed state.

* * * * *